US009018064B2

United States Patent
Waite et al.

(10) Patent No.: US 9,018,064 B2
(45) Date of Patent: Apr. 28, 2015

(54) METHOD OF DOPING A POLYCRYSTALLINE TRANSISTOR CHANNEL FOR VERTICAL NAND DEVICES

(71) Applicant: Varian Semiconductor Equipment Associates, Inc., Gloucester, MA (US)

(72) Inventors: Andrew M. Waite, Beverly, MA (US); Jonathan Gerald England, Horsham (GB); Rajesh Prasad, Lexington, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 0 days.

(21) Appl. No.: 13/938,713

(22) Filed: Jul. 10, 2013

(65) Prior Publication Data
US 2015/0017772 A1    Jan. 15, 2015

(51) Int. Cl.
*H01L 27/115*    (2006.01)
*H01L 21/265*    (2006.01)

(52) U.S. Cl.
CPC ..... *H01L 27/11582* (2013.01); *H01L 21/26506* (2013.01); *H01L 21/265* (2013.01)

(58) Field of Classification Search
None
See application file for complete search history.

(56) References Cited

U.S. PATENT DOCUMENTS

| 5,118,636 | A | * | 6/1992 | Hosaka | 438/421 |
| 6,107,108 | A | * | 8/2000 | Chen et al. | 438/14 |
| 6,440,797 | B1 | * | 8/2002 | Wu et al. | 438/261 |
| 2004/0121551 | A1 | * | 6/2004 | Wang | 438/302 |
| 2009/0173981 | A1 | * | 7/2009 | Nitta | 257/302 |
| 2010/0117152 | A1 | * | 5/2010 | Oh | 257/347 |
| 2012/0051143 | A1 | * | 3/2012 | Yoon et al. | 365/185.22 |
| 2012/0068354 | A1 | | 3/2012 | Tanaka et al. | |
| 2012/0139027 | A1 | * | 6/2012 | Son et al. | 257/324 |
| 2012/0228697 | A1 | * | 9/2012 | Youm et al. | 257/329 |
| 2012/0299005 | A1 | | 11/2012 | Lee | |
| 2013/0161725 | A1 | | 6/2013 | Park et al. | |

FOREIGN PATENT DOCUMENTS

KR    1020120113338 A    10/2012
WO    2012070096 A1    5/2012

OTHER PUBLICATIONS

International Search Report and Written Opinion mailed Oct. 20, 2014 for PCT/US2014/045855, Filed Jul. 9, 2014.

* cited by examiner

*Primary Examiner* — Charles Garber
*Assistant Examiner* — Alia Sabur

(57) ABSTRACT

A method of doping the polycrystalline channel in a vertical FLASH device is disclosed. This method uses a plurality of high energy ion implants to dope the channel at various depths of the channel. In some embodiments, these ion implants are performed at an angle offset from the normal direction, such that the implanted ions pass through at least a portion of the surrounding ONO stack. By passing through the ONO stack, the distribution of ranges reached by each ion may differ from that created by a vertical implant.

19 Claims, 5 Drawing Sheets

Top View

Side View

Front View

METHOD OF DOPING A POLYCRYSTALLINE TRANSISTOR CHANNEL FOR VERTICAL NAND DEVICES

Embodiments of the present disclosure relate to methods of doping a channel in a vertical transistor, specifically to doping a polycrystalline transistor channel in a vertical NAND device.

BACKGROUND

As the desire to integrate more and more transistors onto a single substrate continues to grow, new technologies are developed. Previously, increases in transistor density were largely achieved by the miniaturization of the transistor itself. However, as geometries have continued to shrink, the widths of certain features, such as transistor gates may be less than ten atomic layers. Thus, there is a physical limit to the degree of miniaturization that is possible.

In an attempt to continuing integrating more transistors on a single device, the concept of vertical devices, also known as 3D devices, has gained momentum. Briefly, traditional transistors are made with the source, drain and gate region horizontally oriented. Vertical gates build these features in the vertical direction, thereby reducing the horizontal footprint of each device.

However, there are challenges associated with vertical devices. Specifically, with respect to vertical NAND FLASH devices, the concept of string current has been discussed as a potential issue. The string current, or current in the vertical direction in a vertical NAND FLASH device, is a function of the doping concentration of a polycrystalline channel. Inadequate or non-uniform doping of this channel may degrade the device operating parameters and performance.

Therefore, it would be beneficial if there were a method of doping this polycrystalline channel in a vertical NAND FLASH device such that performance parameters were optimized.

SUMMARY

A method of doping the polycrystalline channel in a vertical FLASH device is disclosed. This method uses a plurality of high energy ion implants to dope the channel at various depths of the channel. In some embodiments, these ion implants are performed at an angle offset from the normal direction, such that the implanted ions pass through at least a portion of the surrounding ONO stack. By passing through the ONO stack, the distribution of ranges reached by each ion may differ from that created by a vertical implant.

In accordance with a first embodiment, a process of creating a doped vertical channel in a three-dimensional structure, where the vertical channel is surrounded by an oxide-nitride-oxide (ONO) stack is disclosed. This method comprises etching a hole through the ONO stack; depositing a polycrystalline silicon material along sidewalls in the hole; and implanting dopant ions into the polycrystalline silicon material using a plurality of high energy ion implants, each of the high energy implants having an implant energy of at least 200 keV and wherein at least one of the implants is performed using an implant energy of at least 1MeV.

In accordance with a second embodiment, a process of creating a doped vertical channel in a three-dimensional structure, where the vertical channel is surrounded by an oxide-nitride-oxide (ONO) stack is disclosed. This method comprises etching a hole through the ONO stack; depositing a polycrystalline silicon material along sidewalls in the hole; and implanting dopant ions into the polycrystalline silicon material at an angle offset from a direction normal to a surface of the structure, wherein the ions pass through a portion of the ONO stack before reaching the polycrystalline silicon material.

In accordance with a third embodiment, a process of creating a doped vertical channel in a three-dimensional NAND FLASH device is disclosed. This process comprises depositing alternating layers of silicon oxide and silicon nitride to create an oxide-nitride-oxide (ONO) stack; etching a hole through the ONO stack; depositing a polycrystalline silicon material along sidewalls of the hole; depositing a dielectric material into the hole after depositing the polycrystalline silicon material; and implanting dopant ions into the polycrystalline silicon material through a plurality of high energy ion implants, each of the high energy implants having an implant energy of at least 200 keV and at least one of the implants performed using an implant energy of at least 1MeV, wherein the implanting is performed at an angle offset from a direction normal to a surface of the device, such that the ions pass through a portion of the ONO stack before reaching the polycrystalline silicon material.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
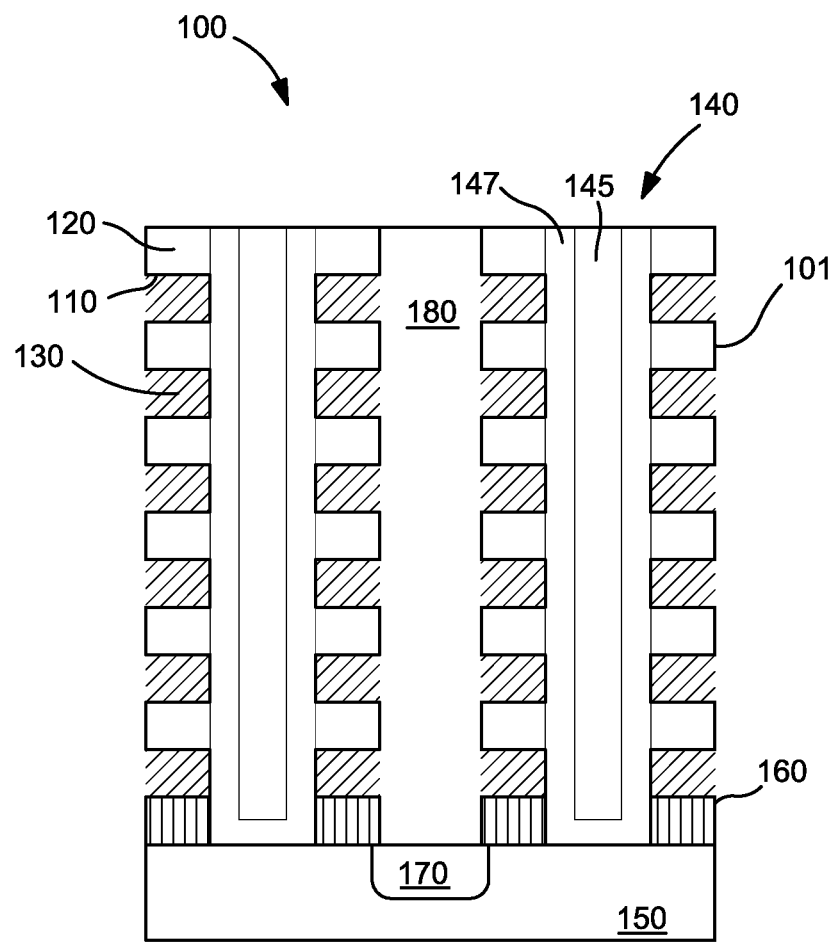
FIG. 1 shows a NAND FLASH device.

The creation of a vertical NAND FLASH device requires a plurality of process steps to build the three-dimensional structure. The final NAND FLASH device 100, shown in FIG. 1, has a plurality of stacked charge traps 101, which are comprised of an ONO layer (oxide-nitride-oxide) 110 applied to an oxide 120, such as silicon oxide. In FIG. 1, the ONO layer 110 is shown surrounding the oxide 120 on three sides (i.e. top, bottom and end). Disposed between the charge traps are metal electrodes 130, which may be comprised of tungsten or some other metal. A plurality of central vertical channels 140 are disposed to which each of the charge traps 101 is in contact. The channel 140 may be in communication with a substrate 150, such as silicon, while the stacked charge traps 101 may be built on a etch stop layer 160, such as tantalum oxide (TaO). A doped source line 170 is disposed between adjacent stacked structures to allow addressing of a specific word or block.

A dielectric or insulating material 145 is disposed in the center of the central vertical channels 140. A semiconductive material 147, such as polycrystalline silicon, is disposed along the sidewalls of the vertical channel 140. In other words, the semiconductive material 147 is disposed between the stacked charge traps 101 and the dielectric material 145. The ONO layer 110 is also disposed adjacent to the semiconductive material 147 in those regions where the oxide 120 is not present. In some embodiments, adjacent stacked charge traps 101 may be separated by a dielectric or oxide material 180.

Figure 2A:
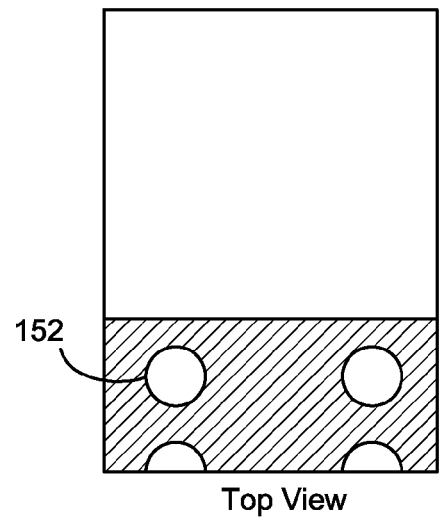
FIG. 2A shows a top view of an intermediate process step in the creation of the NAND FLASH device of FIG. 1.
Figure 2B:
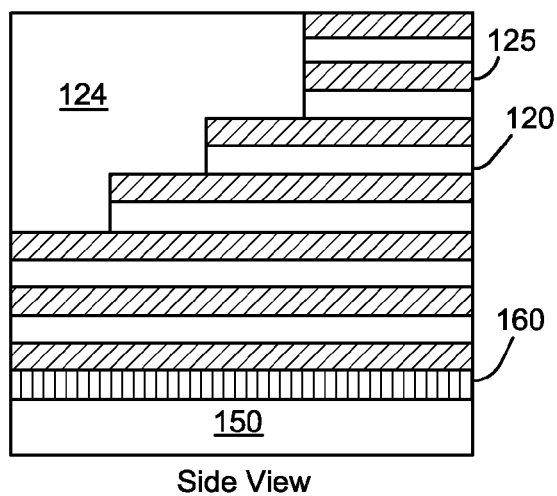
FIG. 2B shows a side view of an intermediate process step in the creation of the NAND FLASH device of FIG. 1.
Figure 2C:
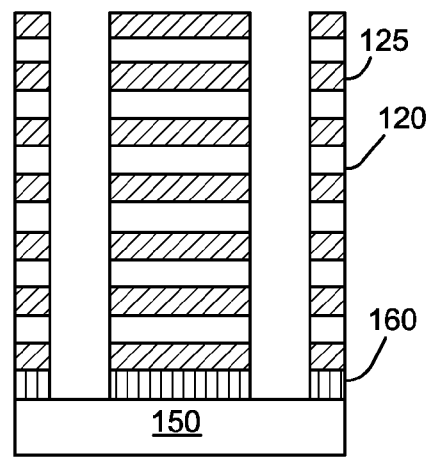
FIG. 2C shows a front view of an intermediate process step in the creation of the NAND FLASH device of FIG. 1.

This process begins by creating a staircased ONO stack with channel holes, as shown in FIGS. 2A-C. FIG. 2A shows a top view of a substrate, while FIGS. 2B and 2C is a side view and a front view, respectively. To create this, an etch stop layer 160, such as tantalum oxide (TaO), is deposited on a doped substrate 150, such as n-doped silicon. Next, a series of alternating oxide layers 120 and nitride layers 125 are deposited on the etch stop layer 160. This creates a block having an ONO layer, which is then subjected to a staircase etch (as is best seen in FIG. 2B). An oxide 124 is then deposited on the substrate in those regions where the staircase etch occurred. This oxide is polished such that a nitride layer 125 is the top layer of the block.

After this, deep holes 152 are etched in the ONO stack. These holes are etched through the ONO stack and the etch stop layer 160 to the substrate 150. After the deep holes 152 are etched, the structure shown in FIG. 2A-C is created. The deep holes 152 are later filled with material to form vertical channels 140.

Figure 3:
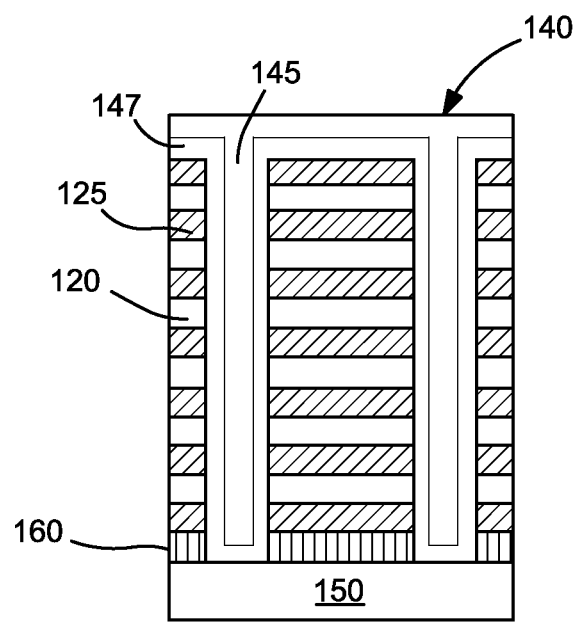
FIG. 3 shows the vertical channel of a NAND FLASH device, having a polycrystalline silicone and dielectric plug.

Next, as shown in FIG. 3, a polycrystalline silicon material 147 is used to coat the sidewalls of the vertical channel 140. A dielectric material 145 is then used to plug the vertical channel 140. This polycrystalline silicon material 147 is used to provide the conductive path between the charge traps, and as such, may be preferably doped to a level of about 1E17 atoms cm$^{-3}$. However, doping this polycrystalline silicon material in the vertical channel 140 is difficult due to its high aspect ratio (its depth divided by its width). For example, the vertical channel 140 may be about 2 μm deep and only about 20 nm wide. In this disclosure, high aspect ratio features may be defined as those having a depth to width ratio of greater than 50. High aspect ratio features are difficult to dope using implant or deposition. For example, the doped polycrystalline silicon channel may be created using doped deposition techniques. This technique, referred to as insitu doped polysilicon deposition, deposits polycrystalline silicon and a dopant, such as boron or phosphorus, simultaneously. However, the distribution of the dopant may not be uniform through the depth of the channel, and may, in some instances, be a function of depth into the channel.

In addition, as the diameter of the vertical channel 140 into which this polycrystalline silicon is deposited shrinks, it may no longer be possible to deposit a tube of polycrystalline silicon. Rather, the polycrystalline material would instead have to be deposited into the deep hole 152 as a thin wire. It may then make it impossible to dope this polycrystalline material with any technique other than MeV implant (through all the layers) or insitu doped polycrystalline silicon. However, as stated above, it is difficult to achieve a uniform doping concentration using insitu doped polycrystalline silicon.

In one embodiment, this polycrystalline silicon material 147 is doped using chained high energy implants. For example, the polycrystalline silicon may be implanted using a series of implants, where each implant has a different implant energy. In this disclosure, an implant is defined as ion implantation at a particular implant energy, which uses one or more dopant ions, to achieve a particular doping profile at a particular depth in the channel. Thus, the number of passes or the duration of time used during a particular implant is not limited. Rather, an implant is defined based on the desire to create the desired dopant concentration at a particular range of depth. In some embodiments, each of these high energy implants may have an energy of at least 200 keV. In some embodiments, the energy used for each of these implants may be between about 200 keV and 2 MeV. In some embodiments, at least one of these implants has an energy of at least 1MeV. In other embodiments, at least one of these implants has an energy of at least 1.4MeV. In another embodiment, at least one of these implants has an energy of at least 1.8MeV. The number of implants performed may vary. For example, in one embodiment, 5 or more implants, each using a different implant energy may be performed. In another embodiment, 7 of more implants, each using a different implant energy, are performed. In another embodiment, 9 implants may be performed. In addition, in one embodiment, the implant energies of the respective implants may vary from each other by about 200 keV, such as 1.8 MeV, 1.6 Mev, 1.4 Mev, etc. These implants of different energy may be performed in any order. In other embodiments, the difference in the implant energy between the various implants may be larger or smaller. In other embodiments, the implant energy difference may not be constant throughout the series of implants. The higher energy implants, such as 1.8 MeV and 1.6 MeV, may be used to dope the polycrystalline material 147 located near the bottom of the vertical channel 140 (such as near substrate 150). Progressively lower energy implants are used to dope regions of the polycrystalline material 147 that are disposed closer to the top surface, such that the implant energy of the implant used to dope the polycrystalline silicon 147 near the top surface may be between 200 keV and 400 keV. In some embodiments, the chained high energy implants are performed as a blanket implant. In other words, the chained high energy implants being applied to the entire device, including the ONO layers. In other embodiments, a patterned implant may be performed so as to implant the ions only in the vertical channel 140.

In some embodiments, the polycrystalline silicon 147 that is deposited is doped insitu, such as with boron, such that both polycrystalline silicon and boron are deposited in the sidewalls of the vertical channel 140. In this case, the subsequent high energy chained implants may be used to equalize the doping concentrations of the previously deposited doped polycrystalline silicon. For example, the intrinsic doping concentration of the polycrystalline material 147 may vary as a function of depth. The chained high energy implants may be used to equalize the concentration throughout the height of the vertical channel 140. In other embodiments, the polycrystalline silicon that is being deposit is not doped. In this embodiment, the doping concentration is added exclusively by the subsequent chained high energy implants.

In some embodiments, the species used for all of the chained high energy implants is boron. In some embodiments, the boron species may be B+. In other embodiments, the boron species is B++, B+++ or B++++. In yet other embodiments, multiple boron species are used. For example, in one embodiment, B++ species are used for one or more of the higher energy implants, while B+ implants are used for one or more of the lower energy implants. In other embodiments, phosphorus ions, such as P+ and P++, may be used as the dopant species for the chained high energy implants. In some embodiments, a single implant may be performed using more than one species, such as B+ and B++. In some embodiments, in addition to the dopant species, a co-implant species, such as carbon, fluorine, or double or multiply charged species carbon or flourine may also be implanted.

In some embodiments, the chained high energy implants are performed at implant energy levels and durations so as to insure a constant doping concentration throughout the vertical channel 140. However, in some embodiments, data may suggest that uniform doping concentration may not be optimal, due to variation of threshold voltages of the charge traps at the various layers. Therefore, in some embodiments, the chained high energy implants can be tailored to create any desired doping concentration along the height of the vertical channel 140 to insure constant threshold voltages for all charge traps.

In other embodiments, the threshold voltage may be varied to compensate for process variation. For example, a higher threshold voltage may be used to compensate for a thin ONO charge trap oxide or a shorter device channel length. In other embodiments, higher threshold voltages may be required near the top (or bottom) of the vertical channel 140. This can be readily accomplished by varying the implant energies and durations of the various chained high energy implants.

For example, in some embodiments, using a technique referred to as automatic process control (APC), the threshold voltages for each charge trap in a device may be measured after the device has been completely processed. Variations in these measured threshold voltage can be used to feedback changes to the implant profile applied to the polycrystalline silicon material to alter the threshold voltages for subsequently processed devices. In other words, the process also includes measuring the threshold voltages of a previously fabricated structure, and optimizing the doping concentration profile of a subsequent device based on these measured threshold voltages. This feedback may be used to affect an operating parameter of the implant, such as the implant dose, implant energy or other operating parameters.

Figure 4:
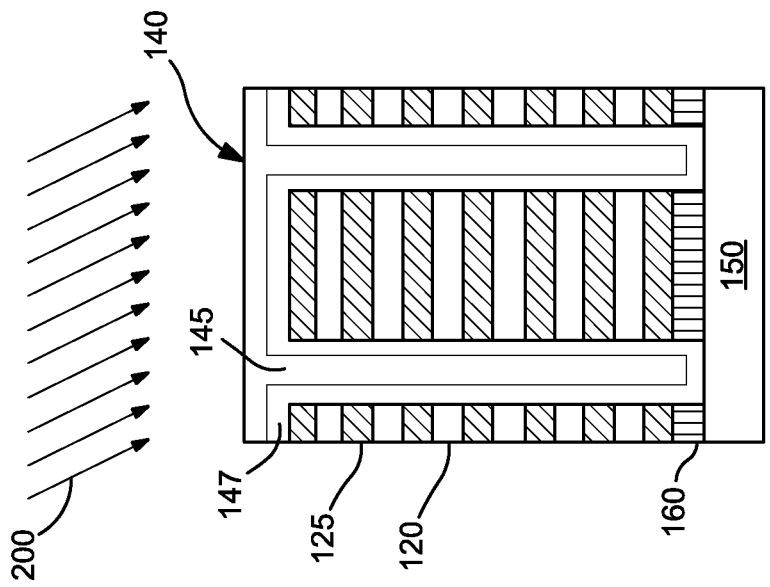
FIG. 4 shows the device of FIG. 3 being subjected to a vertical ion implant.

In some embodiments, the chained high energy implants are performed at an angle normal to the surface of the substrate (defined as a 0° implant), as shown in FIG. 4. In other words, the chained implants are performed in the vertical direction. In this way, ions 200 that are to be implanted into the lower portions of the vertical channel 140 pass only through the polycrystalline material 147 that is disposed directly above it.

Figure 5:
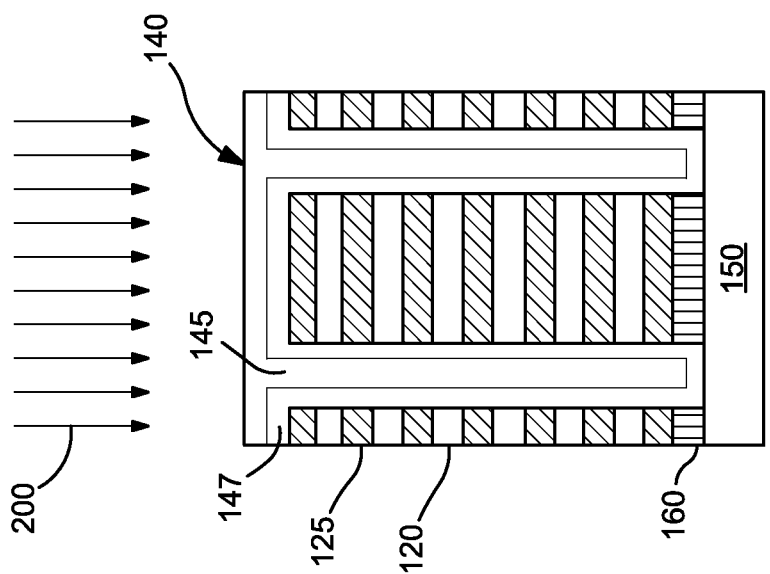
FIG. 5 shows the device of FIG. 3 being subjected to a titled, or angled, ion implant.

In other embodiments, the chained high energy implants are performed at an angle offset from this normal direction, as shown in FIG. 5. For example, angled implants, such as up to about 20°, may be used to dope the polycrystalline silicon material 147. This tilt angle allows ions 200 that are intended to be implanted in the polycrystalline silicon material 147 to pass through one or more of the oxide/nitride layers 120, 125. In other words, the ions pass through at least a portion of the ONO stack. The layers 120, 125 of the ONO stack may have different resistance to the implanted ions. By passing through different materials, the distance the dopant ions travels may change. For example, if a dopant passes through only one material (such as the polycrystalline silicon material 147), then its range will be determined by that material. If the implant is tilted, the dopant ions will pass through several material layers, and the distribution of ranges reached by each ion may differ from that created during a vertical implant. For example, the distribution of ranges for each ion may be tighter than for the vertical implant case.

This tilted implant may be used to provide all of the dopant to the polycrystalline silicon, or may be used to equalize the doping concentration where the channel was created by depositing insitu doped polycrystalline silicon. In other embodiments, this tilted implant is used to create an optimal doping profile based on the threshold voltages of each charge trap.

After the completion of the chained high energy implants, the polycrystalline silicon will have the desired doping concentration, which may be about $1E17$ atoms $cm^{-3}$ or more. In addition, the doping concentration may be uniform throughout the height of the vertical channel 140. In other embodiments, the doping concentration may vary as a function of the height to optimize process parameters, such as the threshold voltage of the charge traps.

Figure 6:
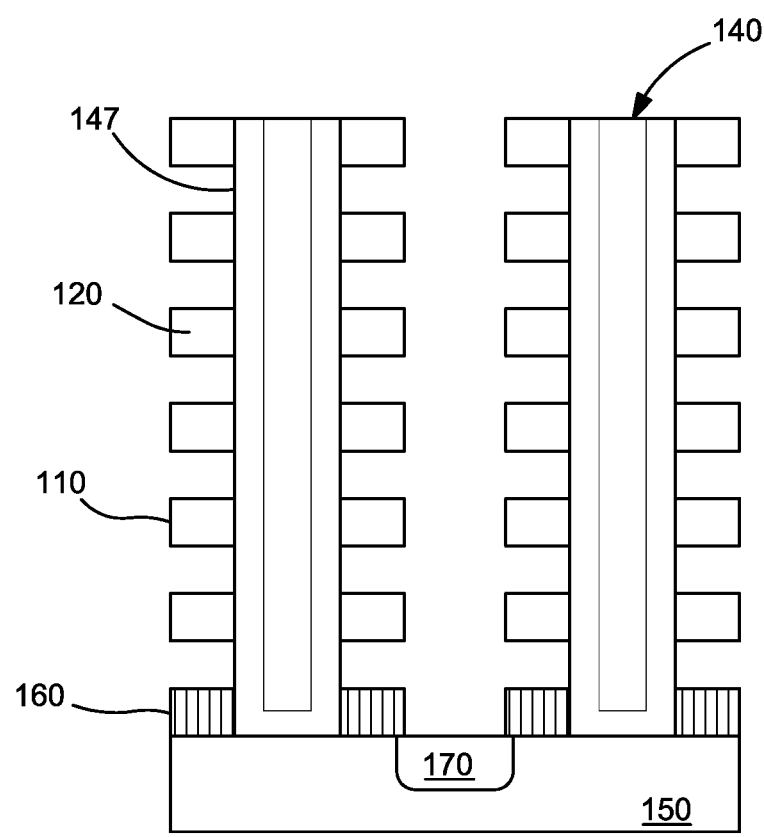
FIG. 6 shows an intermediate process step in the creation of the NAND FLASH device of FIG. 1.

Following the chained high energy implant, the process of fabricating the NAND FLASH device continues. FIG. 6 shows a device in a subsequent stage of fabrication. Following the implant, a slit is etched into the ONO stack, thereby dividing it in half. This etch proceeds through the ONO stack and through the TaO layer 160. A common source line 170 is then created using ion implantation in the substrate 150. All of the silicon nitride is now removed through the use of hot phosphoric acid. This creates the irregular shaped stacks of silicon oxide 120 shown in FIG. 6. An ONO layer 110 is then deposited on the device.

Subsequently, a metal, such as tungsten is deposited and etched away as known in the art to replace the previously removed silicon nitride layers 125 (see FIG. 3). This creates the tungsten electrodes 130 (see FIG. 1). An oxide 180 (see FIG. 1) is then applied. Holes are etched into the oxide 180 (not shown) to allow interconnection to the tungsten electrodes 130. These holes (not shown) are filled with a metal to create a conductive path from the top surface to each tungsten electrode 130.

While the disclosure describes the use of chained high-energy implants at a particular step in the fabrication sequence, the disclosure is not limited to this embodiment. For example, the chained high-energy implants may be performed after the nitride layers 125 have been removed. In this case, a tilted, or angled, implant would still pass through a portion of the ONO stack, as the oxide layers are still present. In other embodiments, the chained high-energy implants may be performed after the metal electrodes have been deposited, such that the tilted implant passes through oxide and electrode layers. Again, since the oxide layers remain, the tilted, or angled, implant is still said to pass through a portion of the ONO stack.

The present disclosure shows the process steps associated with the formation of a NAND FLASH device in accordance with a particular process. However, the use of chained high energy implants can be used in the manufacture of NAND FLASH devices that are made in accordance with other processes as well.

In addition, the chained high energy implants can be used in conjunction with other three-dimensional semiconductor structures which have deep channels that need to be doped. For example, other structures having vertical channels which are surrounded by layers, such as ONO layers or other layers. These other structures include ReRAM, and others.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed:

1. A process of creating a doped vertical channel in a three-dimensional structure, where said vertical channel is surrounded by an oxide-nitride-oxide (ONO) stack, comprising:
etching a hole through said ONO stack;
depositing a polycrystalline silicon material along sidewalls in said hole to form a vertical channel; and
implanting dopant ions into said polycrystalline silicon material, along an entirety of said vertical channel, using a plurality of high energy ion implants, each of said high energy implants having an implant energy of at least 200 keV and wherein at least one of said implants is performed using an implant energy of at least 1MeV.

2. The process of claim 1, wherein dopant is deposited with said polycrystalline silicon material and said implanting is used to equalize a doping concentration profile of said polycrystalline silicon material throughout said vertical channel.

3. The process of claim 1, wherein said three dimensional structure comprises a plurality of charge traps and said plurality of high energy ion implants creates a doping concentration profile of said polycrystalline silicon material that optimizes threshold voltage of each of said charge traps.

4. The process of claim 3, wherein dopant is deposited with said polycrystalline silicon material.

5. The process of claim 3, further comprising measuring said threshold voltages of a previously fabricated structure;
using said measured threshold voltages to determine said optimized doping concentration profile of said polycrystalline silicon material; and
altering an operating parameter of said implant to create said optimized doping concentration.

6. The process of claim 1, wherein said plurality comprises at least five implants, where each of said implants is performed at a different implant energy.

7. A process of creating a doped vertical channel in a three-dimensional structure, where said vertical channel is surrounded by an oxide-nitride-oxide (ONO) stack, comprising:
etching a hole through said ONO stack;
depositing a polycrystalline silicon material along sidewalls in said hole to form a vertical channel; and
implanting dopant ions into said polycrystalline silicon material, along an entirety of said vertical channel, at an angle offset from a direction normal to a surface of said structure, wherein said ions pass through a portion of said ONO stack before reaching said polycrystalline silicon material.

8. The process of claim 7, wherein dopant is deposited with said polycrystalline silicon material and said implanting is used to equalize a doping concentration profile of said polycrystalline silicon material throughout said vertical channel.

9. The process of claim 7, wherein said three dimensional structure comprises a plurality of charge traps and said plurality of high energy ion implants creates a doping concentration profile of said polycrystalline silicon material that optimizes threshold voltage of each of said charge traps.

10. The process of claim 9, wherein dopant is deposited with said polycrystalline silicon material.

11. The process of claim 7, further comprising:
measuring said threshold voltages of a previously fabricated structure;
using said measured threshold voltages to determine said optimized doping concentration profile of said polycrystalline silicon material; and
altering an operating parameter of said implant to create said optimized doping concentration.

12. A process of creating a doped vertical channel in a three-dimensional NAND FLASH device, comprising:
depositing alternating layers of silicon oxide and silicon nitride to create an oxide-nitride-oxide (ONO) stack;
etching a hole through said ONO stack;
depositing a polycrystalline silicon material along sidewalls of said hole to form a vertical channel;
depositing a dielectric material into said hole after depositing said polycrystalline silicon material; and
implanting dopant ions into said polycrystalline silicon material, along an entirety of said vertical channel, through a plurality of high energy ion implants, each of said high energy implants having an implant energy of at least 200 keV and at least one of said implants performed using an implant energy of at least 1MeV, wherein said implanting is performed at an angle offset from a direction normal to a surface of said device, such that said ions pass through a portion of said ONO stack before reaching said polycrystalline silicon material.

13. The process of claim 12, wherein dopant is deposited with said polycrystalline silicon material and said implanting is used to equalize a doping concentration profile of said polycrystalline silicon material throughout said vertical channel.

14. The process of claim 12, wherein said three dimensional NAND FLASH device comprises a plurality of charge traps and said plurality of high energy ion implants creates a doping concentration profile of said polycrystalline silicon material that optimizes threshold voltage of each of said charge traps.

15. The process of claim 14, wherein dopant is deposited with said polycrystalline silicon material.

16. The process of claim 14, further comprising
measuring said threshold voltages of a previously fabricated three-dimensional NAND FLASH device;
using said measured threshold voltages to determine said optimized doping concentration profile of said polycrystalline silicon material; and
altering an operating parameter of said implant to create said optimized doping concentration.

17. The process of claim 12, further comprising:
removing said silicon nitride layers after said depositing of polycrystalline silicon material and dielectric material, thereby creating spaces between said silicon oxide layers; and
depositing a metal in said spaces to form an electrode, wherein said implanting is performed prior to said removing step.

18. The process of claim 12, further comprising:
removing said silicon nitride layers after said depositing of polycrystalline silicon material and dielectric material, thereby creating spaces between said silicon oxide layers; and
depositing a metal in said spaces to form an electrode, wherein said implanting is performed after said removing step and prior to said metal depositing step.

19. The process of claim 12, further comprising:
removing said silicon nitride layers after said depositing of polycrystalline silicon material and dielectric material, thereby creating spaces between said silicon oxide layers; and
depositing a metal in said spaces to form an electrode, wherein said implanting is performed after said removing step and after said metal depositing step.

* * * * *